United States Patent [19]
Chirovsky et al.

[11] Patent Number: 5,581,077
[45] Date of Patent: Dec. 3, 1996

[54] OPTICAL RECEIVER WITH A HIGH IMPEDANCE PREAMPLIFIER

[75] Inventors: Leo M. Chirovsky, Bridgewater, N.J.;
Robert A. Novotny, Naperville, Ill.;
Ted K. Woodward, Lincroft, N.J.

[73] Assignee: Lucent Technologies Inc., Murray Hill, N.J.

[21] Appl. No.: 270,952

[22] Filed: Jul. 5, 1994

[51] Int. Cl.⁶ .................................................. H01J 40/14
[52] U.S. Cl. ..................... 250/214 R; 250/551; 359/189; 330/285
[58] Field of Search ............... 250/214 R, 551, 250/214 A, 214 LS, 214.1; 359/189, 194, 197; 327/514; 330/308, 110, 261, 267, 285

[56] References Cited

U.S. PATENT DOCUMENTS

| | | | |
|---|---|---|---|
| 4,744,105 | 5/1988 | Kasper | 359/189 |
| 4,912,745 | 3/1990 | Fitzpatrick et al. | 326/117 |
| 5,023,951 | 6/1991 | Kahn | 359/189 |
| 5,343,033 | 8/1994 | Cain | 250/214 AG |
| 5,389,776 | 2/1995 | Woodward | 250/214 LS |

OTHER PUBLICATIONS

D'Asaro, L. A., Chirovsky, L. M. F., Laskowski, E. J., Pei, S. S., Woodward, T. K., Lentine, A. L., Leibenguth, R. E., Focht, M. W., Freund, J. M., Guth, G. G., Smith, L. E., "Batch Fabrication and Operation of GaAs–AlxGal–xAs Field–Effect Transistor–Self–Electrooptic Effect Device (FET–SEED) Smart Pixel Arrays," IEEE Journal of Quantum Electronics, vol. 29, No. 2, Feb. 1993, pp. 670–677.

Woodward, T. K., Lentine, A. L., Chirovsky, L. M. F., Focht, M. W., Freund, J. M., Guth, G. D., Leibenguth, R. E., Smith, L. E., D'Asaro, L. A., Laskowski, Pei, S. S., "GaAs/AlGaAs FET–SEED Receiver/Transmitters," OSA Procedings on Photonics in Switching, vol. 16 Jan. 1993, pp. 89–93.

Woodward, T. K., Lentine, A. L., Chirovsky, L. M. F., Pei, S. S., Freund, J. M., D'Asaro, L. A., Focht, M. W., Loaskowski, E. J., Guth, G. D., Smith, L. E., "Operating Characteristics of GaAs/AlGaAs FET–SEED Smart Pixels," IEEE, Apr. 1992, 4 pages.

Primary Examiner—Que T. Le

[57] ABSTRACT

The present invention provides a high impedance optical receiver circuit for use in integrated circuits. The receiver circuit consists of an optical detecting device connected to the gate of an FET device and further connected to a diode providing a load impedance. The FET device is connected to a biasing voltage through a biasing resistive element and to a conditioning stage output. The use of a diode to provide a load impedance allows for a smaller and easier to manufacture receiver circuit than would be possible using either a load resistor or a load FET. According to one aspect of the present invention, a digital integrated circuit employing SEED technology incorporates a plurality of diode-loaded receiver in an array of optical receiver circuits to reduce the footprint of the overall SEED circuit array.

17 Claims, 3 Drawing Sheets

OPTICAL RECEIVER WITH A HIGH IMPEDANCE PREAMPLIFIER

FIELD OF THE INVENTION

The present invention relates to optical receivers employing high impedance preamplifiers, and in particular, integrated circuits employing such receivers.

BACKGROUND OF THE INVENTION

A promising application of light wave transmission lies in facilitating communication between integrated circuits within a system. Integrated circuits, such as memory chips and microprocessors, may communicate data by transmitting and receiving optical signals. Integrated circuits presently effect the transmission and reception of optical signals using Self-Electrooptic Effect Devices (SEEDs). See, Woodward, et al, "Operating characteristics of GaAs/AlGaAs FET-SEED Smart Pixels," 1992 IEDM Tech. Digest p. 655 (IEEE 1992), which is incorporated herein by reference. An integrated circuit employing SEED technology, contains arrays of optical receivers and optical modulators which receive and transmit data respectively. By employing SEED technology in many or all integrated circuits within a system, the problems and limitations resulting from the use of hardwired interconnections, such as wiring complexity, crosstalk, and parasitics may be reduced or eliminated. Such applications involve the inclusion of a substantial number of optical transmitters and receivers in one integrated circuit.

In integrated circuit or microchip design, however, as in all circuit design, the consumption of physical space incurs cost. The implementation of SEED technology requires a significant amount of the substrate surface area, as it encompasses the addition of large numbers of optical receiver and transmitter circuits. As a consequence, any improvement that operates to reduce the footprint, or surface area required by the SEED devices can result in significant financial savings, particularly in mass produced products.

Optical receiver circuits, such as those employed in SEED-based communication systems typically include a preamplifier stage comprising a light detecting device and an amplification device. The preamplifier stage receives light wave or optical signals and provides at its output an electrical signal that is representative of the received optical signal. A number of constraints apply to SEED optical receivers that do not apply in a typical photo-receiver. One constraint is the requirement of a small footprint. Another requirement is that the SEED optical receiver must produce output signals compatible with processing by electronic logic circuitry.

Two classes of preamplifier stages have gained favor with circuit designers, the transimpedance preamplifier stage and the high impedance preamplifier stage. The primary difference between the amplifiers is that transimpedance amplifiers are closed loop devices while high impedance amplifiers are open loop devices. Each class of preamplifiers has its advantages and disadvantages. High impedance preamplifiers, however, combine high sensitivity with a minimal component count, which helps satisfy the constraints discussed above. As a result, integrated circuits employing SEED technology may include an array of optical receivers, each including a high impedance preamplifier stage. Although the use of high impedance preamplifiers reduces the receiver footprint, still further reduction is advantageous.

It is well known that the footprint of a particular circuit may be reduced by optimizing component selection. It is also known that various circuit elements occupy different amounts of the substrate surface. In particular, resistors occupy a relatively large surface area in semiconductor integrated circuits. As a result, it is advantageous to substitute smaller elements for resistors in microchip-based high impedance optical receiver/preamplifiers. It is also known that a field effect transistor (FET) with its gate tied to its source may provide a suitable substitute for a resistor in certain circumstances. Because FETs are smaller than integrated circuit resistors, such as thin-film resistors, FETs are used in place of resistors when possible. FET-type devices, however, typically consist of at least three terminals, each of which requires a portion of the substrate surface.

SUMMARY OF THE INVENTION

The present invention provides a novel single beam optical receiver including a high impedance amplifier. The receiver consists of an optical detecting device connected to both the gate of an FET device and a load diode providing a load impedance. The FET device is connected to a biasing voltage through a biasing impedance, forming a high gain inverter. The use of a diode to provide a load impedance allows for a smaller and easier to manufacture receiver circuit than would be possible using either a load resistor or a load FET.

According to one embodiment of the present invention, a digital integrated circuit employing SEED technology incorporates a plurality of such diode-loaded optical receivers to facilitate optical communications between integrated circuits with minimal consumption of space.

The above-discussed features, as well as additional features and advantages of the present invention, will become apparent by reference to the following detailed description and accompanying drawings.

DETAILED DESCRIPTION OF THE DRAWINGS

Figure 1:
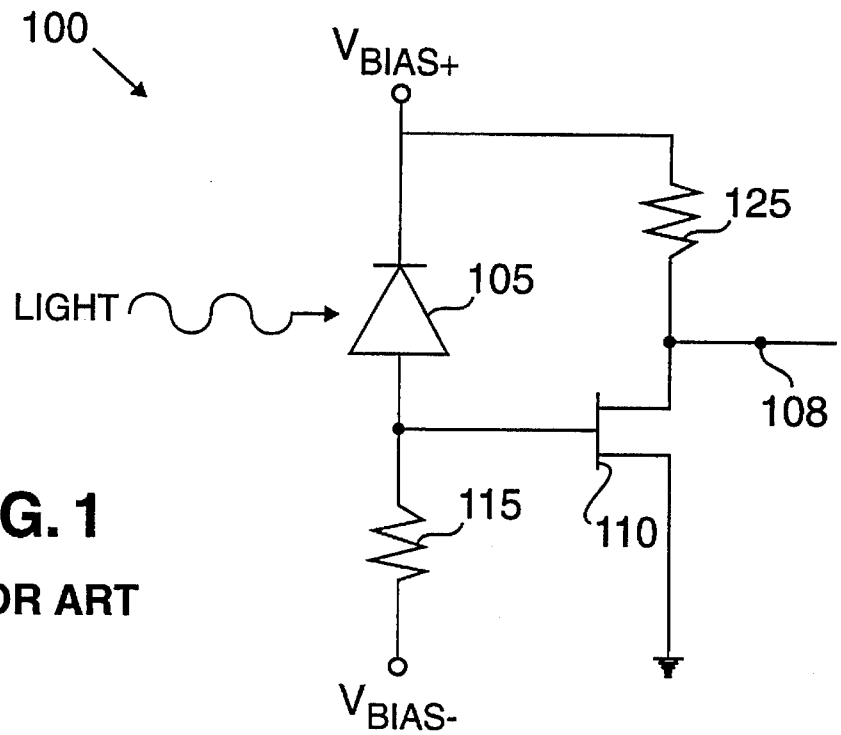
FIG. 1 illustrates an exemplary prior art high impedance optical receiver circuit.

FIG. 1 illustrates an exemplary prior art high impedance optical receiver 100. The receiver 100 receives a light signal at its input, a photodiode 105, and produces an amplified electrical signal representative of the incoming optical signal at an output 108. The cathode of the photodiode 105 is connected to a positive bias voltage VBIAS+ while its anode is connected to both the gate of an FET 110 and a load resistor 115. The load resistor 115 is further connected to a negative bias voltage VBIAS−. The FET 110 is coupled to the output 108 and is further connected to VBIAS+ through a bias resistor 125, forming a known type of high impedance inverter.

When a strong light signal strikes the photodiode 105, the photodiode 105 conducts current in reverse mode, or in other words, from cathode to anode. Thus, current flows from VBIAS+ to VBIAS− through the load resistor 115, thereby raising the gate voltage of the FET 110 in excess of the inverter threshold voltage. The inverter threshold voltage is a voltage above which the inverter produces a low output voltage and below which the inverter produces a high input voltage. Thus, when a strong light signal is striking the photodiode 105, the voltage at the gate of the FET 110 will cause the inverter formed by the FET 110 and the resistor 125 to produce a low output voltage. When the strong light signal is removed or replaced by a weak light signal, the photodiode 105 ceases to conduct current, and the lack of current will decrease the voltage appearing across the load resistor and at the gate of the FET 110. The voltage at the gate of the FET 110 falls below the threshold voltage of the inverter. As a result, the inverter formed by the FET 110 and the resistor 125 will produce a high output voltage.

In addition to the substantial circuit footprint required by the load resistor 115, the receiver 100 is only useful for a limited range of input currents. Because the resistor 115 has a linear relationship between current and voltage, the voltage change induced by increasingly large input current variations increases without bounds. Such large voltage excursions may saturate or otherwise adversely affect the operation of the FET 110, thereby limiting the useful range of input currents that can be accommodated.

To reduce the footprint, it is known that if the load resistor 115 is removed from the circuit in FIG. 1, a strong light signal will nevertheless cause the inverter to produce a low output voltage. In such a case, the light signal causes the photodiode to conduct current which charges the gate capacitance of the FET 110, thereby causing the gate voltage of the FET 110 to exceed the inverter threshold voltage. It is noted, however, that when the strong light signal is removed, the gate capacitance has no discharge path, as it does when the resistor 115 is present. Thus, the inverter formed by the FET 110 and the resistor 125 continues to produce a low output voltage after the strong light signal is removed.

It is also known that a second photodiode may be implemented to provide the required discharge path. See Woodward, et al., "Operating Characteristics of GaAs/AlGaAs FET-SEED Smart Pixels," cited above. In such an implementation however, a second light beam is required to activate the discharge path when the original strong light signal is removed.

Figure 2:
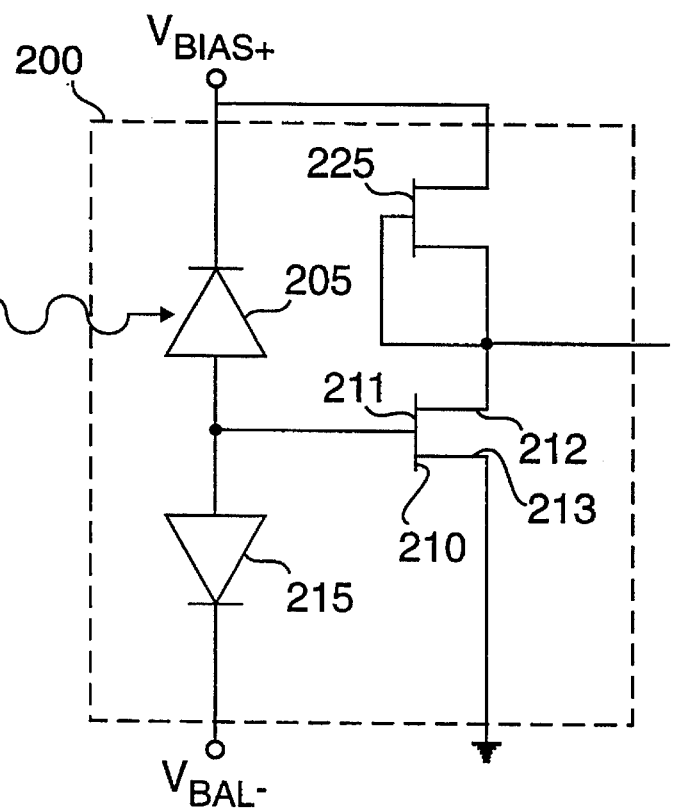
FIG. 2 illustrates a novel high impedance optical receiver circuit operable to convert input light signals to electrical digital signals according to the present invention.

FIG. 2 illustrates a circuit including a novel high impedance single beam optical receiver 200 comprising a photodiode 205, an FET 210 having a gate 211, a drain 212 and a source 213, a load diode 215, and a bias FET 225.

The photodiode 205, which may suitably be a GaAs multiple quantum well p-i-n, a p-i-n, metal semiconductor, Schottky or an avalanche photodiode, comprises an anode and a cathode. The cathode is connected to a first bias voltage VBIAS+ and the anode is connected to both the gate 211 of the FET 210 and the anode of the load diode 215. The load diode 215 may suitably be a GaAs p-n junction diode, a Schottky diode, a p-i-n junction diode, or a silicon-based diode. The photodiode 205 is reverse biased with respect to the load diode 215. The cathode of load diode 215 is connected to a balancing voltage, VBAL−. The voltages VBIAS+ and VBAL− may suitably be +10 Vdc and −1 Vdc, respectively. Such voltage levels are given by way of example, other suitable levels may be employed. The relationship between the operation of the circuit and VBIAS+ and VBAL− is explained further below.

The drain 212 of the FET 210 is connected to a second bias voltage, which may suitably be the same as the first bias voltage, VBIAS+, through the bias FET 225. The FET 210 and the bias FET 225, as configured, comprise a known form of a high gain inverter that provides preamplification and operates in essentially the same manner as the inverter discussed above in connection with FIG. 1. The high gain inverter formed by the FETs 210 and 225 produces at its output, which is the drain 212 of the FET 210, a high logic voltage level or a low logic voltage level, depending upon the input voltage at the gate 211. The FETs 210 and 225 may be GaAs doped channel heterojunction FETs, doped channel HFETs, GaAs MESFETs, or silicon based FETs. The source 213 of the FET 210 is connected to ground.

In a first embodiment of the receiver 200, the photodiode 205 is a GaAs multiple quantum well (mqw) p-i-n modulator, the load diode 215 is a GaAs Schottky diode, and the FETs 205 and 225 are GaAs doped-channel heterojunction FETs. The inverter formed by the FETs 205 and 225 exhibits a threshold voltage of approximately −0.3 Vdc in this embodiment.

In operation, the receiver 200 receives digital light signals, the digital light signals having a first level of intensity representative of one binary value and a second intensity level representative of the other binary value. A signal of the first intensity level will be referred to as a strong light signal and a signal of the second intensity level will be referred to as either a weak light signal or the lack of a strong light signal. The receiver 200 converts the digital light signals into digital electrical signals in the manner discussed below.

When a strong light signal strikes the photodiode 205, the photodiode 205 conducts current at a first current level. The first current level is imposed upon the load diode 215, forward biasing the load diode 215 and causing the load diode 215 to exhibit a first voltage drop $V_{d1}$ in accordance with its voltage-current or v-i characteristic. The v-i characteristic of an ideal forward-biased diode is $I=I_0 e^{cv}$, where $c$ and $I_0$ are device dependent constants.

Figure 3:
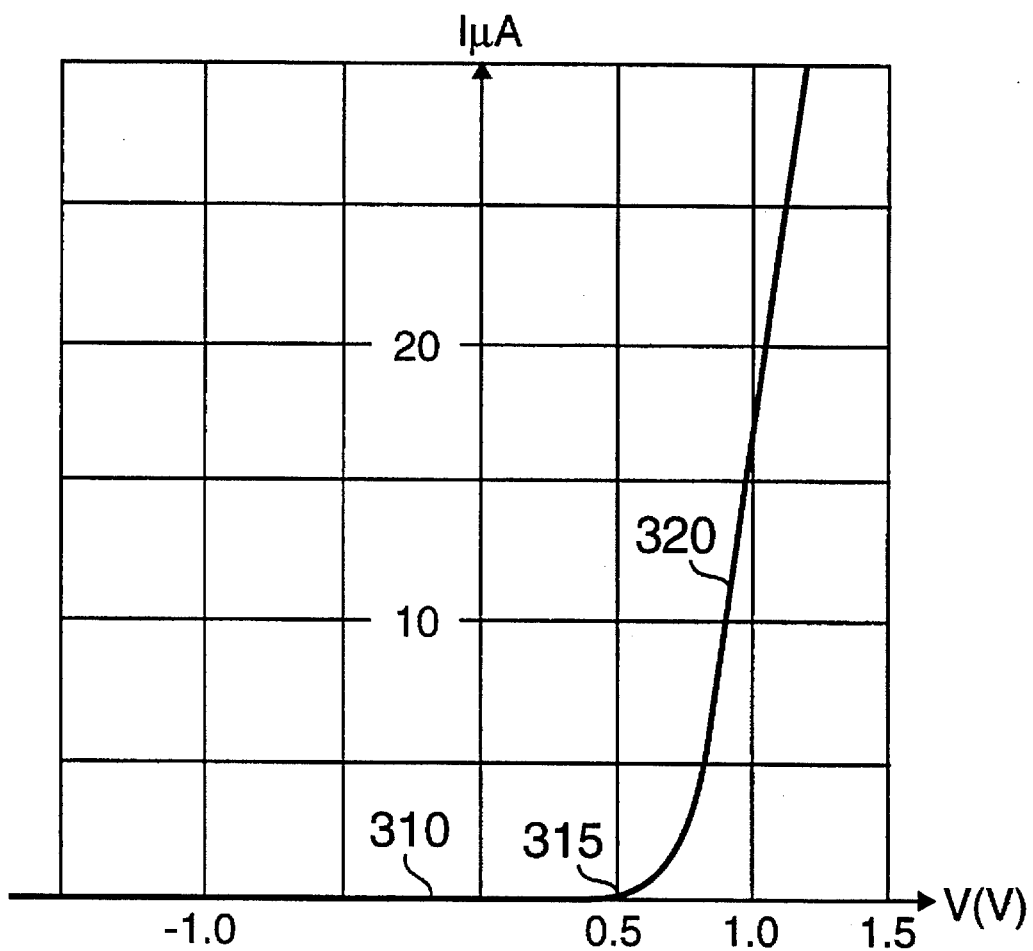
FIG. 3 illustrates a graph of the load characteristic for a diode which may suitably be employed in an optical receiver operating according to the present invention.

A typical v-i characteristic for a forward-biased diode is illustrated in FIG. 3. For relatively low bias voltages, the curve 310 is flat and very little current is conducted. For bias voltages above some threshold 315, the current curve 320 increases rapidly as a function of bias voltage. The load diode 215 should be chosen such that the current from the photodiode 205 under a strong light signal causes $V_{d1}$ to exceed the threshold 315, for reasons that will be explained further below. In the first embodiment, for example, a 10 μW light signal may be used to provide a strong light signal, which in turn causes the photodiode 215 to conduct current at approximately 5 μA. The load diode 215 in this embodiment exhibits a voltage drop of approximately 0.72 vdc at 5 μA of current.

When the voltage drop of the load diode is equal to $V_{d1}$, the voltage at the gate 211 exceeds the inverter threshold voltage, which causes the inverter to produce a low logic output voltage. To this end, VBAL− should be chosen such that VBAL−, when added to $V_{d1}$, produces a voltage at the gate 211 that exceeds the inverter threshold voltage. For example, in the first embodiment of this circuit, VBAL− is suitably −1 Vdc.

Thereafter, when the strong light signal is removed or replaced by a weak signal, the photodiode 205 produces a current at a second level that is lower than the first current level. The second level of photodiode current may suitably comprise essentially no current.

At that instant, the inherent capacitance of the gate 211 maintains the first voltage drop level, $V_{d1}$, across the load diode 215. This charge on the gate 211 subsequently discharges through the load diode 215. As the gate 211 discharges, the voltage drop across the diode 215 decreases, and the discharge current decreases. In other words, the voltage drop of the load diode 215 moves from right-to-left on the graph in FIG. 3.

The gate 211 continues to discharge at least until the voltage at the gate falls sufficiently below the inverter threshold to change the inventor output to the high logic level. At this point, the voltage drop exhibited by the load diode 215 is defined as $V_{d2}$, where $V_{d2}$ comprises a second load diode voltage drop that is lower than $V_{d1}$. The voltage at the drain 212 of the FET 210 then rises to a high logic voltage level. It should be noted that because $V_{d1}$ was chosen on a point on the portion 320 of the curve in FIG. 3, relatively large levels of discharge current flow through the diode 215, allowing the gate to discharge to below the inverter threshold voltage fairly rapidly, which is essential for high speed operation.

To accomplish the foregoing, VBAL− must be adjusted so that $V_{d1}$ and $V_{d2}$ cause the voltage at the gate 211 to fall on either side of the inverter threshold voltage. Furthermore, the load diode 215 should preferably exhibit at least a 200 mV difference between $V_{d1}$ and $V_{d2}$, to insure complete switching of the inverter during high frequency operation of on the order of 200 Mbit/s. This requirement is due to the fact that an inverter does not switch perfectly at its gate threshold voltage, but over a range, which in the case of the inverter used in embodiment A is 30 mv. Diodes having suitable v-i characteristics may be readily selected by those of ordinary skill in the art.

The receiver 200, as described above, produces an electrical binary signal version of the input digital light signal, and, moreover, offers spatial advantages and manufacturing advantages over the receiver 100 illustrated in FIG. 1. In particular, by replacing the load resistor 115 with the load diode 215, the circuit 200 consumes less chip surface space. Moreover, due to their physical structure, diodes are less costly to incorporate into a integrated circuit than resistors. In comparison, the known alternative of replacing the load resistor with an FET, while constituting an improvement, nevertheless occupies more surface area than the load diode.

It should further be noted that because the diode has ideally an exponential relationship between current and voltage, an improved dynamic range of input currents may be accommodated. Large input currents do not produce excessively large voltage excursions at the input to the FET 210 as they would using a load resistor because the load diode 215 tends to saturate.

A diode, however, is not typically used as a resistor substitute, such as, for example, an FET with its gate tied to its source, primarily because the diode response is extremely nonlinear. This nonlinearity introduces substantial distortion that would be unacceptable in many circuits in which an optical receiver is used. It has been found, however, that for an optical receiver used for digital signal transmission between integrated circuits, the load need not behave predominantly as a resistor. The flexible load requirement is due in part to the nature of digital communications wherein the optical signal only has two states, high (1) or low (0). As a result, the signal distortion caused by the nonlinear diode response is tolerable.

It is to be noted that a circuit similar to that described as the first embodiment has been operated successfully with a 300 Mbit/s intensity modulated digital light signal. It was found that at considerably higher speeds, the input capacitance of the FET 210 began to impair performance.

Figure 4:
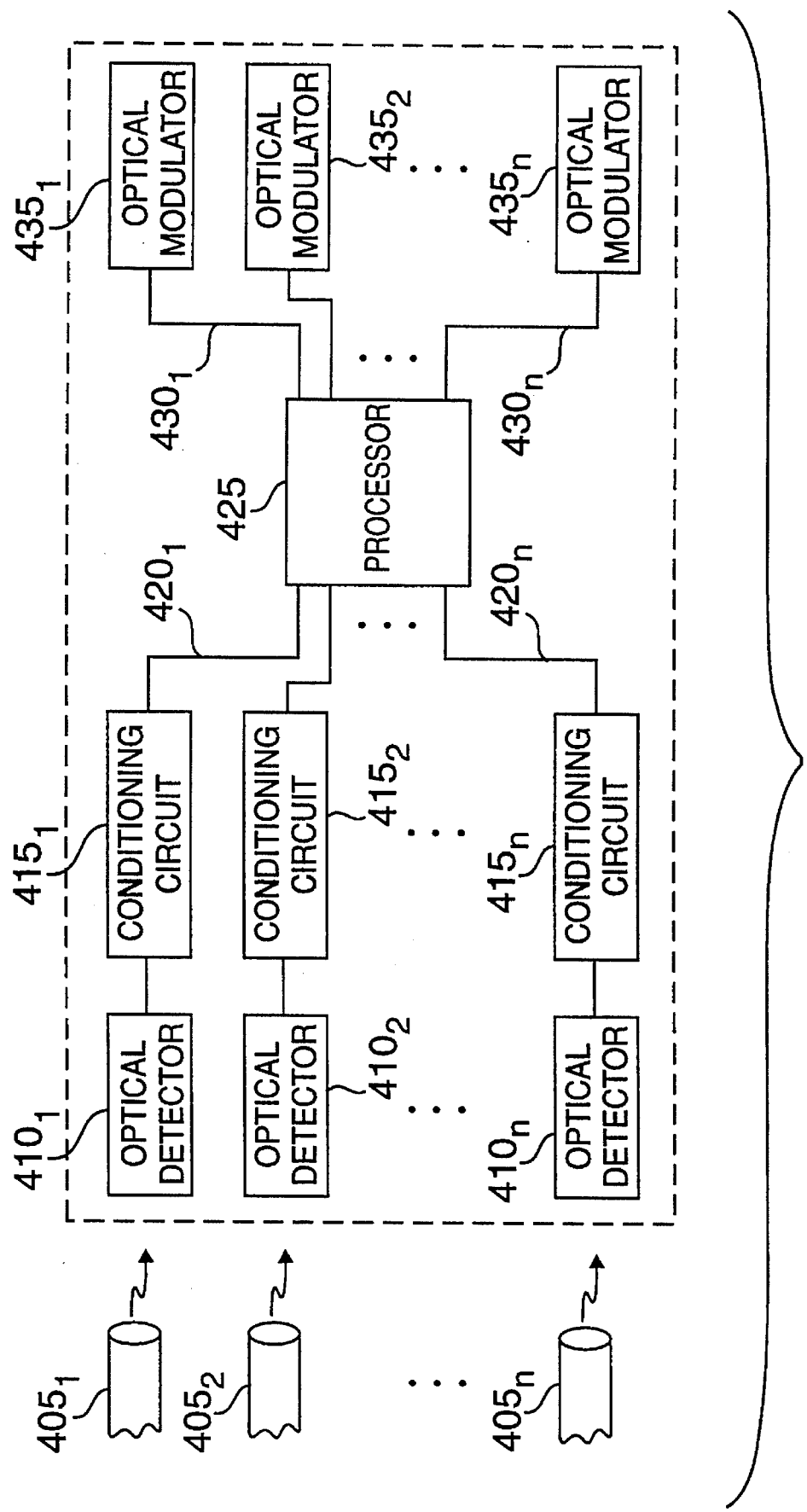
FIG. 4 illustrates a block diagram of an integrated circuit including a plurality of high impedance optical receivers operating according to the present invention.

FIG. 4 illustrates an integrated circuit 400 which is operable to accomplish opto-electrical interconnection with other integrated circuits using FET-SEED technology. An integrated circuit as described herein means a circuit having all circuit elements built into a single semiconductor substrate. The integrate circuit 400 may be either monolithically integrated or hybrid. Particular details regarding FET-SEED communication between integrated circuits may be found for example, in Woodward, et al., "GaAs/AlGaAs FET-SEED Receiver/Transmitters," OSA Proc. on Photonics in Switching p. 89 (Optical Society of America 1993), which is incorporated herein by reference; and Woodward, et al., "Operating Characteristics of GaAs/AlGaAs FET-SEED Smart Pixels," cited above.

The integrated circuit 400 is situated in a location within a circuit arrangement, not shown, to receive directed optical input signals from a substantial plurality of sources $405_1$ through $405_n$. The optical signal sources $405_1$ through $405_n$ may suitably comprise FET-SEED modulators located on one or more other integrated circuits, not shown.

The integrated circuit 400 comprises a monolithic GaAs chip having a substantial plurality of optical detectors $410_1$ through $410_n$, each of which is connected to one of a substantial plurality of signal conditioning devices $415_1$ through $415_n$. Each of the detectors $410_1$ through $410_n$ comprises the optical receiver circuit 200 discussed above in connection with FIG. 2. The signal conditioning devices $415_1$ through $415_n$ comprise any suitable circuit elements capable of converting input binary signals to signal levels appropriate for the particular logic family used. Circuitry capable of producing appropriate BJT levels, FET levels or levels compatible with any other standard logic family is well known to those of ordinary skill in the art. The signal conditioning devices $415_1$ through $415_n$ are in turn coupled by lines $420_1$ through $420_n$ to a block of digital processing circuitry 425. The digital processing circuitry 425 may comprise a series of logic gates, a gate array, or one or more microprocessors.

The precise number of the substantial plurality of optical detectors $410_1$ through $410_n$ depends on the digital processing circuitry involved. The advantages of the present invention are substantial in circuits having over 100 parallel inputs. With the advanced state of microelectronics, digital processing circuitry such as, for example, a large scale random access memory, an advanced microprocessor or parallel processor often requires 1000 parallel inputs or more. The size advantages of the present invention are further amplified with respect to such devices.

Various output lines $430_1$ through $430_n$ of the digital processing circuitry 425 are coupled to line driver circuits $435_1$ through $435_m$. Each of the line driver circuits $435_1$ through $435_m$ may suitably comprise a SEED-type modulator for producing optical output signals. See, for example, "GaAs/AlGaAs FET-SEED Receiver/Transmitters", cited above.

The circuit described above operates in the following manner. A plurality of digital optical signals from a plurality of optical signal sources $405_1$ through $405_n$ strike a plurality of detector circuits $410_1$ through $420_n$. Preferably, each digital optical signal $OPT_x$ is directed to strike a particular detector circuit $410_x$. Techniques for generating and directing optical signals between integrated circuits are well known. F. B. McCormick et al., "Six Stage Digital Free Space Optical Switching Network Using Symmetric Self-Electrooptic Effect Devices," *Applied Optics*, Vol. 32, p. 5153 (Sep. 10, 1993).

Each detector circuit $410_x$ then produces at its output an electrical binary signal $EL_x$ in some form. By electrical binary signal it is meant that one voltage level represents a "1" value and another voltage level represents a "0" value. The signal conditioning circuits $415_1$ through $415_n$ adjust these "1" and "0" voltage levels so that they conform with the levels required by the logic family employed in the digital circuitry 425. In some cases, the optical detectors $410_1$ through $410_n$ produce binary signal levels which are already compatible with the digital circuitry 425. In such cases, the signal conditioning circuits $415_1$ through $415_n$ are not required.

In any event, each conditioned signal $EL_x$ is provided to the digital processing circuitry 425 through an input line $420_x$. Optimally, each detector circuit $410_x$ is physically located in close proximity to the portion of the digital processing circuitry 425 that processes the input from the signal source $405_x$. This placement of the detector circuits $410_1$ through $410_n$ minimizes the physical length of the input lines $420_n$ through $420_n$ which in turn conserves substrate area. The digital circuitry 425 processes the incoming data and provides a plurality of output signals on output lines $430_1$ through $430_m$. In order to transfer the data from the output lines $430_1$ through $430_m$ to the appropriate destination, for example, another integrated circuit, not shown, the output signals are provided to line drivers $435_1$ through $435_m$. The line drivers $435_1$ through $435_m$ then prepare and transmit the outgoing signals by known techniques.

In another embodiment of the present invention, the positions of the photodiode 205 and the load diode 215 of the circuit illustrated in FIG. 2 may be interchanged to form a non-inverting receiver. The appropriate bias voltages required to implement such an embodiment would be apparent to one of ordinary skill in the art.

Additionally, it may be advantageous to employ the load diode 215 in combination with a parallel load resistor. The load resistor serves to provide a load impedance for voltage levels at which the load diode 215 conducts very little current. While the addition of the load resistor somewhat improves the range of inverter threshold voltage levels which may be accommodated, the spatial advantages of the present invention are lost.

It is to be understood that the above-described arrangements of the invention are merely illustrative. Other arrangements may be readily devised which will embody the principles of the invention and fall within the spirit and scope thereof. For example, while the bias FET 225 provides a biasing impedance for the FET 210 in FIG. 2 above, a resistor or other suitable biasing impedance may be used, although at some spatial cost. Likewise, while the load diode 215 is shown as a discrete element in FIG. 2, an inherent diode formed by the gate-source junction of some FETs, which are well known to those of ordinary skill in the art, may instead be employed as the load diode 215, if appropriate biasing levels are employed. Furthermore, the integrated circuit 400 may be formed from a material other than GaAs, such as silicon.

We claim:

1. An optical receiver circuit for use in an integrated circuit, the optical receiver circuit operable to receive signal beam optical signals and produce electrical signals representative of the optical signals, the optical receiver circuit comprising:

a) a photodiode having a cathode and an anode, the cathode connected to a first bias voltage and the anode connected to a load diode, the photodiode being reverse biased with respect to the load diode; and b) a high impedance preamplifier comprising a FET including a gate, a drain and a source, the gate connected to both the anode of the photodiode and the load diode, and the drain connected to a second bias voltage through a biasing impedance.

2. The optical receiver circuit of claim 1 further comprising a conditioning stage connected to the drain of the FET.

3. The optical receiver circuit of claim 1 wherein the photodiode comprises a multiple quantum well p-i-n photodiode.

4. The optical receiver circuit of claim 1 wherein the biasing impedance comprises a bias FET, the bias FET including a gate and a source, said FET having its gate and source tied together.

5. The optical receiver circuit of claim 1 wherein the biasing impedance comprises a resistor.

6. The optical receiver circuit of claim 1 wherein the photodiode, the load diode, the FET and the biasing impedance are monolithically integrated on a single semiconductor substrate.

7. A monolithic integrated circuit comprising:

a) a plurality of optical receiver circuits, each optical receiver circuit operable to receive single beam optical signals and produce electrical signals representative of the optical signals, the optical receiver circuits each comprising:

a photodiode having a cathode and an anode, the cathode connected to a first bias voltage and the anode connected to a second diode, the photodiode being reverse biased with respect to the second diode; and a high impedance preamplifier comprising a FET including a gate, a drain and a source, the gate connected to both the anode of the photodiode and the diode, and the drain connected to a second bias voltage through a biasing impedance;

b) digital processing circuitry having a plurality of inputs and one or more outputs, each input connected to at least one optical receiver circuit, and c) one or more line drivers connected to the one or more outputs of the digital circuitry.

8. The integrated circuit of claim 7 wherein at least one or more of the line drivers comprises an optical modulator.

9. The integrated circuit of claim 7 wherein the digital circuitry includes a microprocessor.

10. The integrated circuit of claim 7 wherein the digital circuit includes a gate array.

11. The integrated circuit of claim 7 wherein the plurality of optical inputs comprises at least 1000 optical inputs.

12. An optical receiver circuit operable to receive single beam digital light signals, the light signals having first and second intensity levels, each intensity level representative of one binary value, the receiver circuit comprising:

a) a photodiode having a cathode and an anode, the cathode connected to a first bias voltage, said photodiode operable to produce first and second current levels, each current level corresponding to one of the two light intensity levels;

b) a load diode having a cathode and an anode, the anode of the load diode anode connected to the anode of the photodiode, said load diode operable to produce a first voltage drop upon imposition of the first photodiode current level thereon, and a second voltage drop upon imposition of the second photodiode current level thereon; and c) a high impedance preamplifier having an input and an output, the input connected to the anode of the load diode, the preamplifier operable to produce a high logic output voltage corresponding to the first load diode voltage drop and a low logic output voltage corresponding to the second load diode voltage drop.

13. The circuit of claim 12 wherein the photodiode comprises a GaAs multiple quantum well p-i-n diode and the load diode comprises a GaAs Schottky diode.

14. The circuit of claim 12 wherein the high gain inverter comprises an FET having a gate, a drain and source connected through a biasing impedance to a second bias voltage.

15. The circuit of claim 12 wherein the cathode of the load diode is connected to a balancing voltage, the balancing voltage in combination with the first load diode voltage drop is sufficient to cause the inverter to produce the high logic output voltage, and the balancing voltage in combination with the second load voltage drop is sufficient to cause the inverter to produce the low logic output voltage.

16. The circuit of claim 12 wherein the first load diode voltage drop exceeds the second load diode voltage drop by at least 200 mV.

17. The circuit of claim 12 wherein the photodiode, the load diode and the inverter are monolithically integrated on a single semiconductor substrate.

* * * * *